United States Patent
Hama

(10) Patent No.: US 7,155,659 B2
(45) Date of Patent: Dec. 26, 2006

(54) ERROR DETECTION AND CORRECTION CIRCUIT

(75) Inventor: Hiroshi Hama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 353 days.

(21) Appl. No.: 09/816,644

(22) Filed: Mar. 23, 2001

(65) Prior Publication Data

US 2001/0039639 A1 Nov. 8, 2001

(30) Foreign Application Priority Data

Mar. 27, 2000 (JP) .......................... 2000-085901
Mar. 27, 2000 (JP) .......................... 2000-085902

(51) Int. Cl.
    *H03M 13/00* (2006.01)

(52) U.S. Cl. .................. 714/785; 714/781; 714/758; 714/746; 714/800; 714/752; 714/762; 375/340; 360/53; 370/216

(58) Field of Classification Search ................ 714/785, 714/758, 775, 755, 779, 746, 800, 752, 712, 714/776, 762, 773; 375/340, 240.15; 360/53; 370/216; 700/9

See application file for complete search history.

(56) References Cited

U.S. PATENT DOCUMENTS

| 4,077,565 | A | * | 3/1978 | Nibby et al. ................. 714/758 |
| 5,095,417 | A | * | 3/1992 | Hagiwara et al. .............. 700/9 |
| 5,383,205 | A | * | 1/1995 | Makihara et al. ........... 714/773 |
| 5,737,022 | A | * | 4/1998 | Yamaguchi et al. ... 375/240.15 |
| 6,618,450 | B1 | * | 9/2003 | Hatta ......................... 375/340 |

FOREIGN PATENT DOCUMENTS

JP             06-77844       3/1994

* cited by examiner

Primary Examiner—Guy J. Lamarre
Assistant Examiner—Dipakkumar Gandhi
(74) Attorney, Agent, or Firm—Hogan & Hartson LLP

(57) ABSTRACT

A signal separation circuit (11) normally outputs a main signal, but outputs a TMCC signal when an error detection and correction unit (4) sets a completion flag. Main signals are input via a selection circuit (3) to an execution unit (4), where error correction of the main signals is performed. The error-corrected main signals are supplied via a switching circuit (8) to a first data output circuit (9). Meanwhile, TMCC signals are input via the selection circuit (3) to an execution unit (4), error correction is carried out to the TMCC signals. The error-corrected TMCC signals are supplied via switching circuit (8) to a second data output circuit (10).

11 Claims, 4 Drawing Sheets

ERROR DETECTION AND CORRECTION CIRCUIT

BACKGROUND OF THE INVENTION

1. Field of the Invention

The present invention relates to an error correction circuit for correcting an error in a received digital television broadcasting signal.

2. Description of the Related Art

Recent common technology for supplying digital TV broadcasting signals enables commercial digital television broadcasting. Two types of digital television broadcasting are now available, one in which digital TV broadcasting signals are transmitted via a satellite, and one in which such signals are transmitted terrestrially. In the following, satellite digital television broadcasting will be described.

FIG. 3 is a diagram showing a structure of digital data corresponding to one frame to be received by a satellite digital broadcasting receiver, in which each frame of digital data contains 39936 symbols. Here, one symbol refers to the signal or signals received in synchronism with one clock. The head of one frame comprises a TMCC (Transmission Multiplexing Configuration Control) signal and a synchronous word signal, wherein the TMCC signal contains control information concerning a slot signal and a transmission method, and wherein the synchronous word signal contains a total of forty symbols. The TMCC signal and the synchronous word signal together comprise 192 symbols, and both signals are transmitted in the form of a binary phase shift keying modulation signal (BPSK).

Following the TMCC signal and the synchronous word signal, data (video, audio, and so on) and a carrier clock burst signal are alternately arranged. Each data item has 203 symbols, while each carrier clock burst signal has four symbols. The carrier clock burst signal is a BPSK modulation signal.

While data consisting of 203 symbols and TMCC signal or the synchronous word signal consisting of one symbol together make one set, successive 204 symbols are referred to as one slot.

Each slot is modulated using various modulation methods. After being frequency locked (phase locked), a synchronous word is detected for establishment of frame synchronism. Then, the content of a TMCC signal is demodulated to determine the modulation method used to modulate the data to be transmitted, and the order in which the data is to be transmitted. Modulation methods may include 8PSK, QPSK (Quadrature PSK), BPSK, and so on.

FIG. 4 is a diagram showing a structure of a satellite digital broadcasting receiver. A digital television signal sent via a satellite is subjected to synchronism detection in a tuner 61, where frequency down conversion is also applied. Resultant signals I and Q are output from the tuner 61 to an orthogonal phase demodulation circuit 62 for demodulation to thereby generate baseband of the signals I and Q. Thereafter, PSK demodulation circuit 63 applies various PSK demodulation to the signals I and Q to thereby produce a PSK demodulated signal. The PSK demodulated signal is given error correction in an error correction circuit 64. An error-corrected PSK demodulated signal is decoded into motion picture data and/or audio data using MPEG (Motion Picture Experts Group) 1 and/or MPEG 2 method in a signal processing circuit 65.

Here, a conventional error correction circuit comprises paths dedicated respectively to data containing a video signal and an audio signal (hereinafter referred to as a main signal), and to a TMCC signal, and conducts error correction in the respective paths. In satellite digital television broadcasting, which employs Reed Solomon Codes, a transmitter side applies Reed Solomon Coding by imparting an error detection redundancy signal to a main signal and a TMCC signal, while a receiver side processes the coded main and TMCC signals using the redundancy signal to determine for correction an error position in the respective signals.

However, conventional provision of an error correction circuit for every signal strain necessitates two error correction circuits. Moreover, use of separate Reed Solomon demodulation circuits for a main signal and a TMCC signal by each error correction circuit results in wasteful circuit structure, and integration of these circuits onto a semiconductor substrate results in a large scale circuit.

SUMMARY OF THE INVENTION

The present invention has been conceived to overcome the above problems and aims to reduce the size of an error correction circuit.

According to the present invention, error correction of first and second signals is conducted using a single circuit. This enables size reduction of an error correction circuit by making best use of the circuit's potential.

A first signal may be a main signal of a digital television signal, while a second signal may be a TMCC signal of the same. A TMCC signal is divided into sub-signals for insertion into a main signal, so that the main signal and the inserted TMCC sub-signals can be collectively rendered to error correction. This enables more preferable error correction.

BRIEF DESCRIPTION OF THE DRAWINGS

The above and other objects, features, and advantages of the present invention will become further apparent from the following description of the preferred embodiment taken in conjunction with the accompanying drawings wherein.

DESCRIPTION OF THE PREFERRED EMBODIMENTS

Figure 1:
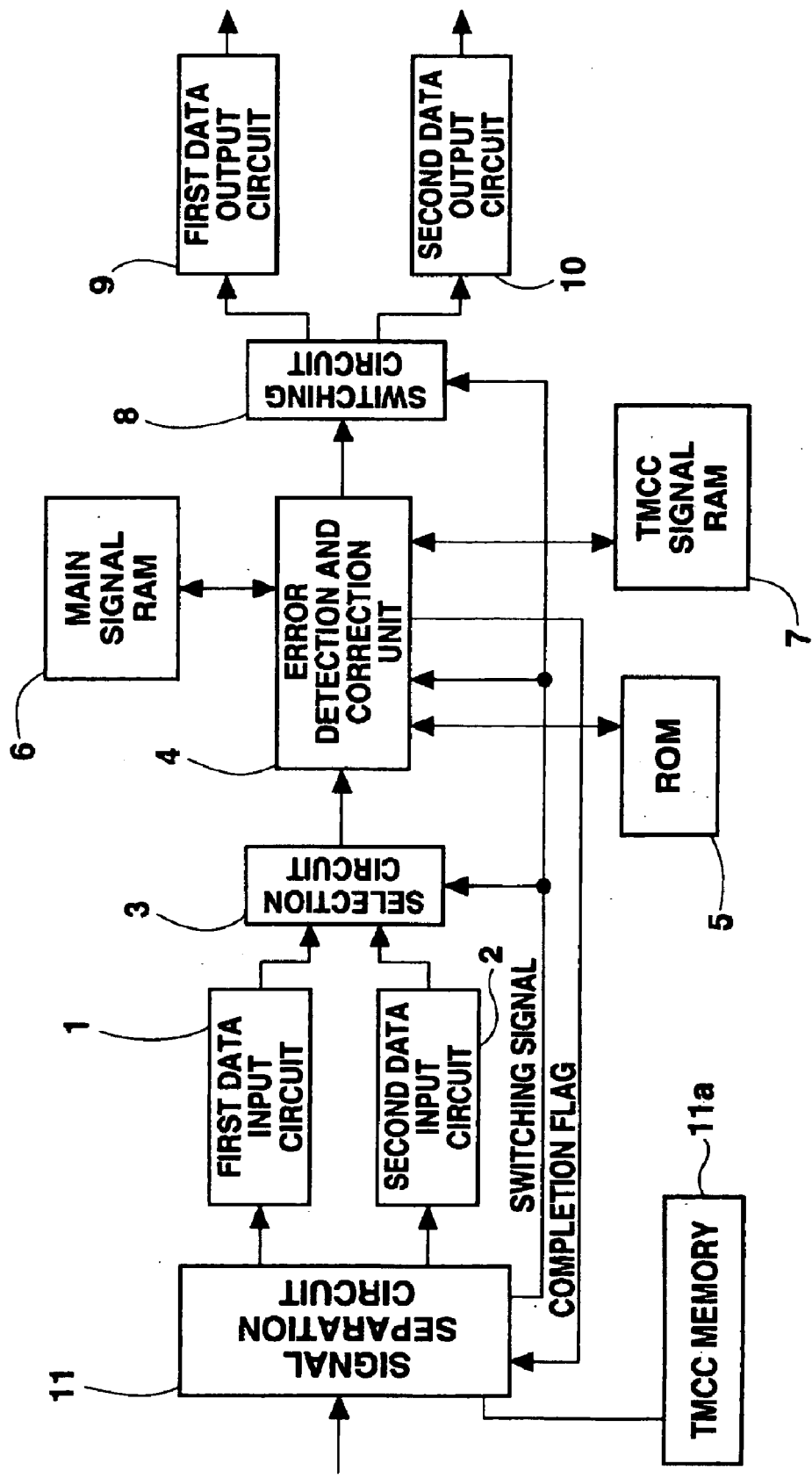
FIG. 1 is a block diagram showing a preferred embodiment of the present invention.

FIG. 1 is a diagram showing a preferred embodiment of the present invention. A main signal is input to a first data input circuit 1, while a TMCC signal is input to a second data input circuit 2. A selection circuit 3 selects an output either from the first or second data input circuit 1, 2 according to a switching signal. An error detection and correction unit 4 conducts Reed Solomon demodulation. As an example, the error detection and correction unit 4 calculates a syndrome based on an output signal from the selection circuit 3, determines the position and magnitude of an error based on the obtained syndrome, and replaces, when possible, the error value with a correct value. That is, the error detection and correction unit 4 carries out error correction to either a main or TMCC signal depending on a switching signal.

A ROM 5 stores coefficients for use in division in Euclidean operation (described below). A main signal RAM 6 stores a main signal and a corrected main signal, while a TMCC signal RAM 7 stores a TMCC signal and a corrected main signal. A switching circuit 8 supplies an output signal from the execution unit to either a main signal path or to a TMCC signal path according to a switching signal. A first data output circuit 9 receives an error-corrected main signal from the switching circuit 8, and forwards this signal to subsequent circuits. A second data output circuit 10 receives an error-corrected TMCC signal from the switching circuit 8, and forwards this signal to subsequent circuits.

A signal separation circuit 11 receives a demodulated digital television signal, and extracts a main signal and a TMCC signal from the received signal. The signal separation circuit 11 then supplies the extracted main signal to the first data input circuit 1, and the TMCC signal to the second data input circuit 2 whenever TMCC sub-signals corresponding to one block have accumulated. It should be noted that a TMCC signal for one block is actually transmitted as 64 TMCC sub-signals, and that each TMCC sub-signal is stored in a TMCC memory 11$a$ until TMCC sub-signals for 64 frames are accumulated. TMCC sub-signals for 64 frames make a complete TMCC signal for one block. Once a complete TMCC signal becomes available, the signal separation circuit 11 then forwards the complete TMCC signal to the subsequent circuit.

Figure 2:
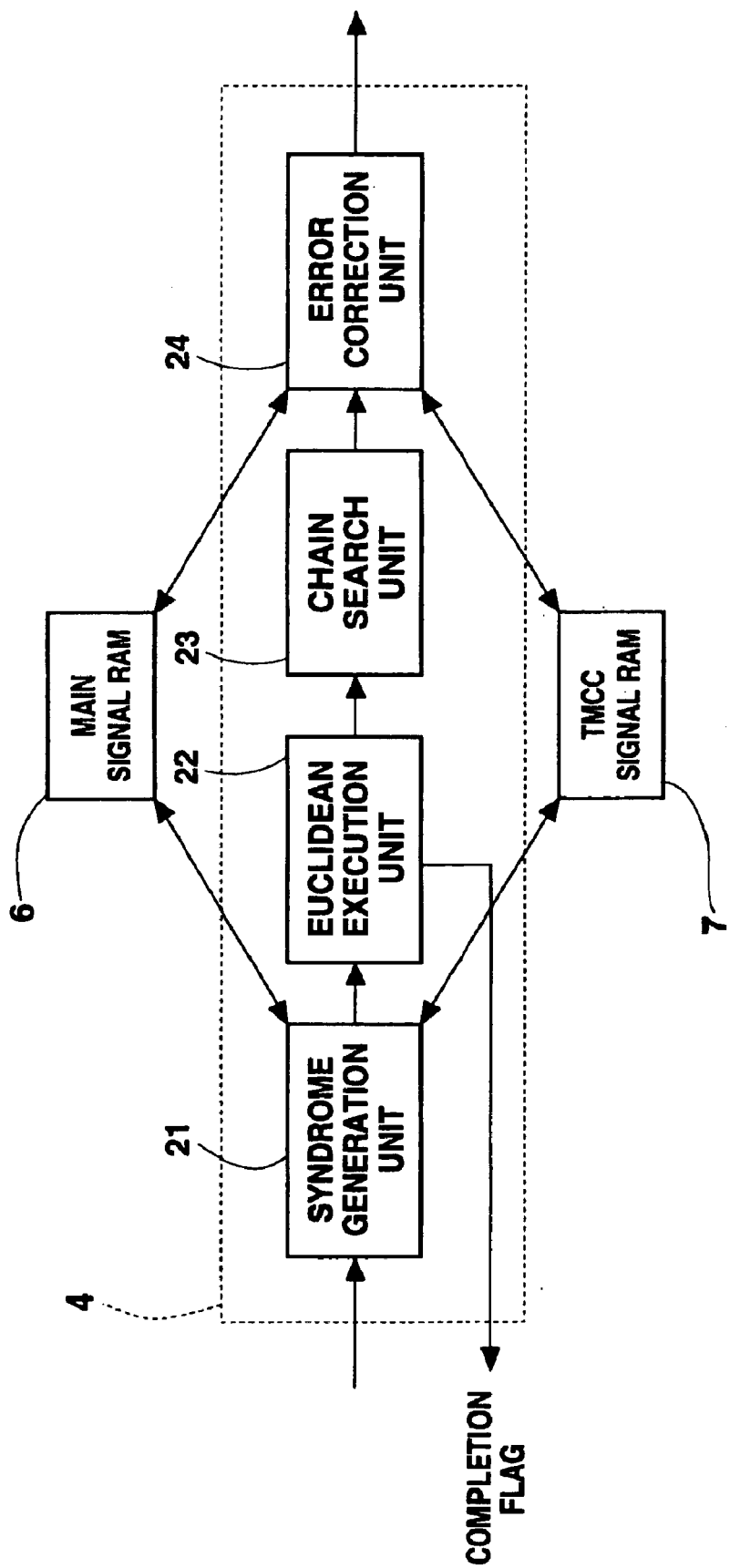
FIG. 2 is a block diagram showing a specific circuit example of an error detection and correction unit 4 shown in FIG. 1.
Figure 3:
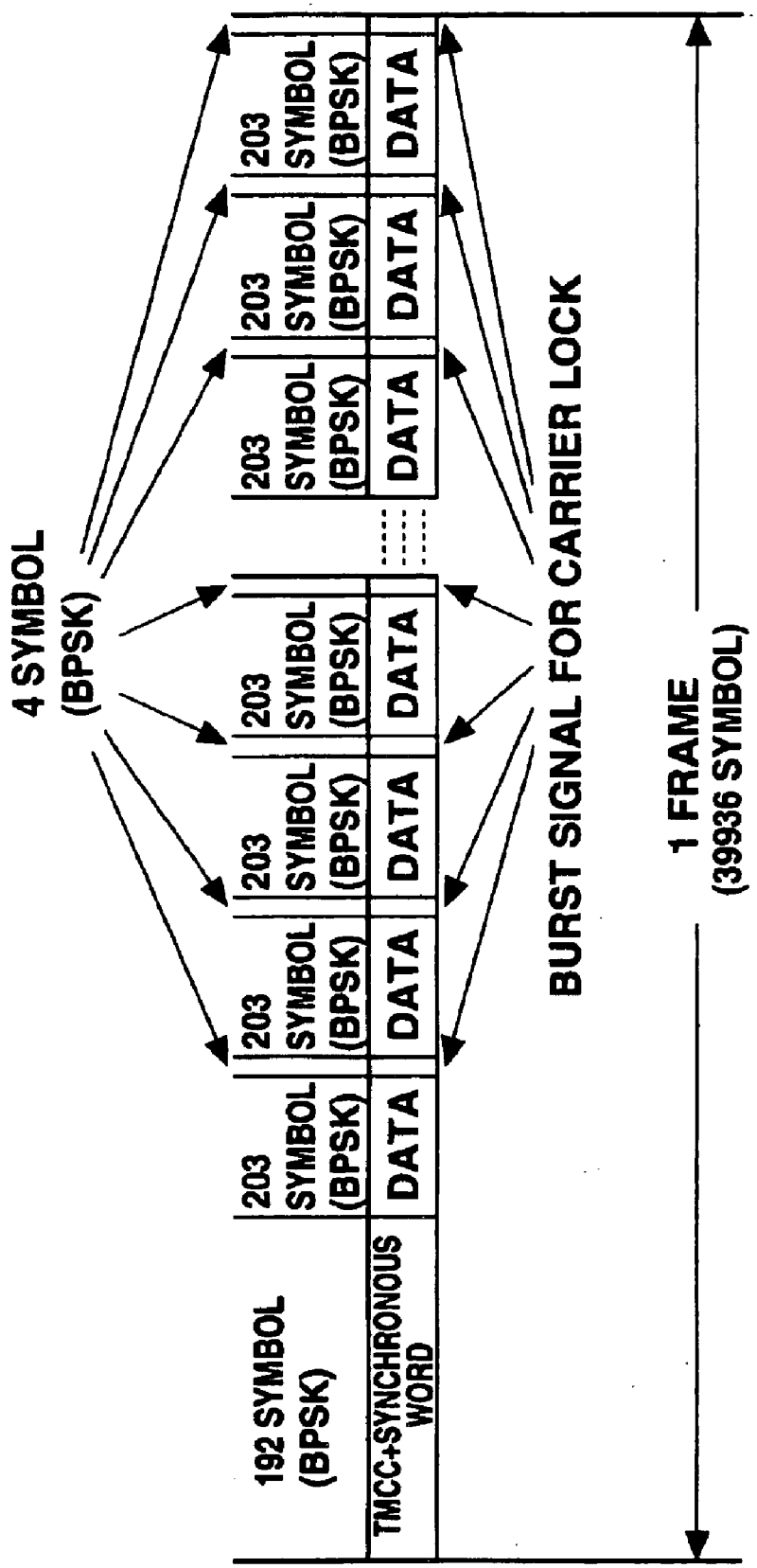
FIG. 3 is a diagram showing data structure of a digital television signal.
Figure 4:
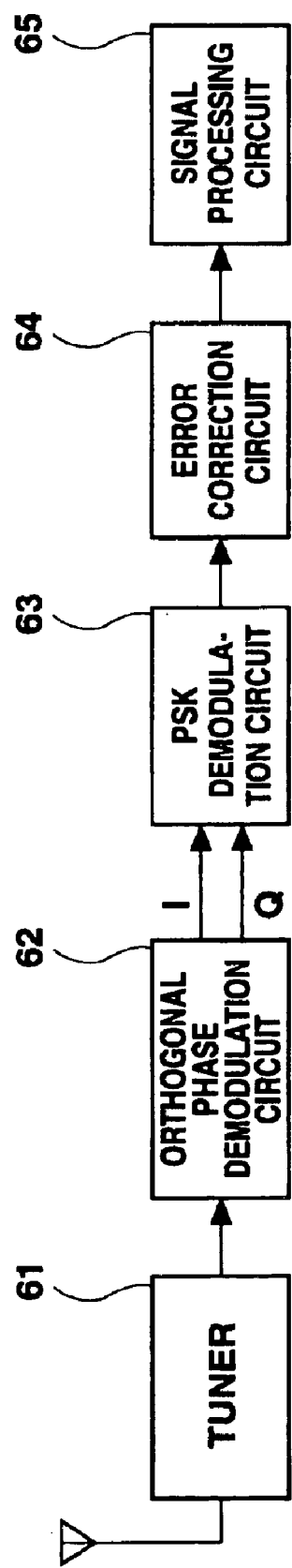
FIG. 4 is a block diagram showing a structure of a satellite digital receiver.

FIG. 2 is a diagram showing a specific circuit example of the execution unit 4. A syndrome generation unit 21 generates a syndrome based on a main signal or a TMCC signal stored in the RAM 6 or 7. A Euclidean execution unit 22, serving as a polynomial execution unit, obtains an error position polynomial $\sigma(z)$ and an error value polynomial $\omega(z)$, based on the generated syndrome. A code minimum distance for a satellite digital television signal is seventeen. Euclidean operation, for example, is suitable for a large code minimum distance, such as the present case. Euclidean operation, which obtains the greatest common polynomial of two given polynomials, employs repetitive divisions between polynomials defined on Galois. For two polynomials defined on Galois and denoted as A(z) and B(z), divisions between polynomials defined based on Galois are repeated as shown below until the greatest common polynomial (i.e., a polynomial in which a dividee polynomial has a smaller degree than that in a divider polynomial) is obtained.

A(z)/B(z)=Q0 (z) quotient . . . R0(z) remainder

B(z)/R0(z)=Q1 (z) quotient . . . R1(z) remainder

R0(z)/R1(z)=Q2 (z) quotient . . . R2(z) remainder

The obtained greatest common polynomial expresses an error relationship formula, and is used for generation of an error position polynomial $\sigma(z)$ and an erroneous value polynomial $\omega(z)$.

Obtainment of these polynomials marks completion of Euclidean operation, and a completion flag is therefore set. It should be noted that a coefficient for use in execution of Euclidean algorithm is read from the ROM 5.

A chain search unit 23, serving as an error position determination unit, calculates an error position and an erroneous value (corresponding to a correct value) based on the error position polynomial $\sigma(z)$ and the erroneous value polynomial $\omega(z)$. That is, an error position is obtained based on the error position polynomial $\sigma(z)$, which was obtained in the Euclidean execution unit 22. Specifically, $\alpha^i$ (i=0, 2, 3, . . . n−1), which is the power of $\alpha$ ($\alpha$ is an element of Galois GF (28)), is subsequently substituted into the error position polynomial $\sigma(z)$ in order to obtain root $\alpha^i$ of $\sigma(z)$ with $\sigma(\alpha^i)$ being zero. In the above, the root $\alpha^i$ corresponds to an error position. It is to be noted that n refers to a code length.

Based on the error position determined in the chain search unit 23, an error correction unit 24 reads a main or TMCC signal which contains an error from RAM 6 or 7. Simultaneously, the error correction unit 24 obtains an erroneous value (corresponding to a correct value) based on the erroneous value polynomial $\omega(z)$ from the Euclidean execution unit 22 and the error position determined. The erroneous data read from the RAM 6 or 7 is corrected into a correct value, and stored in the RAM 6 or 7, replacing its corresponding erroneous data. The above defined correction will thereafter be repeatedly conducted based on an error position i determined and an erroneous value polynomial $\omega(z)$.

Reed Solomon decoding using Euclidean operation is detailed in Japanese Patent Application Laid-open No. Hei 6-77844.

Referring to FIG. 1, as described above, a standard TMCC signal is actually transmitted in the form of 64 sub-signals, one for each frame (39936 symbols). That is, 64 sub-signals together comprise a meaningful signal which contains control information concerning a slot signal and a transmission method. In this embodiment, the signal separation circuit 11 has a TMCC memory 11$a$, where a TMCC sub-signal, sent for each frame, is accumulated until 64 sub-TMCC signals are stored. When 64 sub-TMCC signals have been stored, the signal separation circuit 11 is in condition capable of outputting a complete TMCC signal.

Meanwhile, a main signal is received for every block, and the signal separation circuit 11 supplies the received main signal to the first data input circuit 1. Therefore, the error detection and correction unit 4 conducts error correction generally to a main signal, and sets a completion flag for every completion of error correction to a main signal. When a completion flag is set, it can be understood that the error detection and correction unit 4 is in condition capable of receiving another input signal.

When the signal separation circuit 11 has received 64 TMCC sub-signals and also detects a completion flag, the signal separation circuit 11 sends the TMCC signal to the second data input circuit 2, and the error detection and correction unit 4 conducts error correction to the TMCC signal. Although not all of the above conditions are satisfied, the signal separation circuit 11 continues sending a main signal. Because the signal separation circuit 11 refers to a completion flag while sending a main signal, signal transfer is made efficient.

As described above, once a complete TMCC signal becomes available while error correction is being conducted to main signals, the error correction to the main signals is interrupted by error correction to the complete TMCC signal.

Referring again to FIG. 1, a switching signal from the signal separation circuit 11 becomes H level at, e.g., a timing when a main signal is input to the error detection and correction unit 4, and L level at a timing when a TMCC signal is input to the error detection and correction unit 4.

Specifically, for an H level switching signal, a main signal from the first data input circuit 1 is input via the selection circuit 3 to the error detection and correction unit 4. The input main signal is then stored in the main signal RAM 6 to be read therefrom for subsequent error correction, in which Euclidean operation and chain search are applied to the read main signal to determine any error position and erroneous value. Any error in the signal may be corrected, when possible, into a correct value. The error-corrected main signal is stored in the RAM 6, and read therefrom to be supplied, via the switching circuit 8, to the first data output circuit 9.

For an L level switching signal, a TMCC signal from the second data input circuit 2 is input to the error detection and correction unit 4 via the selection circuit 3. The input TMCC signal is then stored in the TMCC signal RAM 7 to be read therefrom for subsequent error correction, in which Euclidean operation and chain search are applied to a TMCC signal to determine its error position and an erroneous value. Any error in the signal may be corrected, if possible, into a correct value. The error-corrected TMCC signal is stored in the RAM 7, and read therefrom to be supplied, via the switching circuit 8, to the second data output circuit 10.

It should be noted that, whereas two memories, RAMS 6 and 7, are used in the embodiment shown in FIG. 1, the present invention is not limited to such a circuit structure. Alternatively, one memory may be commonly used for both main and TMCC signals. In such a case, a single memory having two regions, a main signal region and a TMCC signal region, may be formed such that respective syndromes originated from a main signal and a TMCC signal are stored in and read from the respective regions. In a circuit structure employing a single address circuit for address designation, when error correction to either a main signal or a TMCC signal should be suspended, an address immediately before the suspension must be stored so that error correction can be resumed beginning with that address.

According to the present invention, alternate error correction to a main signal and a TMCC signal is achieved as these signals are not received simultaneously. Generally, suspended supply of main signals would adversely affect audio and video reproduction as a main signal contains audio and video signals. According to the present invention, however, influence on the reproduced video and audio can be reduced significantly because error correction is applied mainly to a main signal with a TMCC signal appearing only at a relatively small frequency compared to the main signal. As described above, error correction to both main and TMCC signals is achievable using only a single (main signal) execution unit 4.

Although the processing of satellite digital television broadcasting signals was described in the above, the present invention is not limited to satellite digital television broadcasting employing Reed Solomon demodulation, a main signal, and a TMCC signal. The present invention is also applicable to any signals other than those employing Reed Solomon demodulation, as long as two types of signals alternately appear. The advantages of the present invention are most clearly pronounced when one of the two types of signals, such as a TMCC signal, appears with relatively small frequency compared to a main signal.

In addition, the present invention is not limited to Reed Solomon demodulation using Euclidean operation, but can be applied to other demodulation methods. Further, the timing for setting a completion flag is not limited to the point of completion of Euclidean operation, but can be set upon completion of any step which is regarded appropriate in view of the overall circuit structure or demodulation method employed. Still further, whereas in the above example, the signal separation circuit 11 outputs a TMCC signal upon detection of a completion flag set and determination of the fact that a complete TMCC signal for one block becomes available, this circuit may output a second signal regardless of the form of determination that a complete second signal for an entire block has become available.

According to the present invention, the number of error detection and correction circuits can be reduced as error correction to a main signal and a TMCC signal can be carried out using a single circuit. This allows circuit size reduction.

According to the present invention, error correction to a TMCC signal interrupts error correction to a main signal. As a result, error correction to a main signal and a TMCC signal can be achieved using only a single error circuit. This also enables circuit size reduction.

What is claimed is:

1. An error detection and correction circuit for detecting and correcting an error in an input signal containing a first signal and a second signal, comprising:

a signal separation circuit for receiving the input signal and extracting the first signal and the second signal from the received signal, the signal separation circuit providing a switching signal;

a selection circuit for selecting either the first signal or the second signal in the input signal to an error detection and correction unit depending on the switching signal input signal, the selected first signal or second signal providing an input to an error detection and correction unit;

an error detection and correction unit for detecting and correcting an error in an output signal from the selection circuit;

a switch circuit for receiving a switching signal from the signal separation circuit for outputting an output signal from the error detection and correction unit to either an output path for the first signal or an output path for the second signal; and a memory;

and wherein the signal separation circuit separates the second signal from the input signal and sends the second signal to the memory;

the memory stores the second signal until an amount of the stored second signal becomes a predetermined amount; and the error detection and correction unit receives the predetermined amount of the second signal where the amount of the second signal in the memory becomes the predetermined amount.

2. An error detection and correction device according to claim 1, wherein the error detection and correction unit includes the memory, and the memory stores the first signal and the second signal.

3. An error detection and correction device according to claim 2, wherein the memory has a first predetermined area storing the first signal and a second predetermined area storing the second signal.

4. An error detection and correction device according to claim 1, wherein the error detection and correction unit receives the first signal when the first signal is supplied, and conducts error correction to the first signal received, and the error detection and correction unit receives the second signal when the second signal is supplied, and conducts error correction to the second signal received.

5. An error detection and correction device according to claim 1, wherein the first signal occupies a larger portion of the input signal than the second signal.

6. An error detection and correction device according to claim 1, wherein the first signal is a main signal and the second signal is a TMCC signal, and wherein both are present in a received signal for satellite digital television broadcasting.

7. An error detection and correction circuit for detecting and correcting an error in an input signal containing a first signal and a second signal, comprising:
  a signal separation circuit for receiving the input signal and extracting the first signal and the second signal from the received signal, the signal separation circuit providing a switching signal,
  a selection circuit for selecting either the first signal or the second signal in the input signal to an error detection and correction unit depending on the switching signal input signal, the selected first signal or second signal providing an input to an error detection and correction unit;
  an error detection and correction unit for detecting and correcting an error in an output signal from the selection circuit; and
  a switch circuit for receiving a switching signal from the signal separation circuit for outputting an output signal from the error detection and correction unit to either an output path for the first signal or an output path for the second signal; wherein
  the error detection and correction signal sets a completion flag upon completion of error detection and correction with respect to the first signal received, and
  the signal separation circuit supplies the second signal to the selection circuit when the signal separation circuit receives the second signal and detects the completion flag.

8. An error detection and correction device according to claim 7, wherein
  the error detection and correction unit calculates a syndrome based on the input signal, processes the syndrome calculated to calculate an error position polynomial and an erroneous value polynomial, and conducts error correction based on the error position polynomial calculated and the erroneous value polynomial calculated, and
  the error detection and correction unit sets the completion flag upon completion of calculation of an error position polynomial and an erroneous value polynomial with respect to the first signal.

9. An error detection and correction device according to claim 7, wherein the first signal occupies a larger portion of the input signal than does the second signal.

10. An error detection and correction device according to claim 9, wherein the signal separation circuit supplies the second signal to the signal selection circuit when the signal separation circuit receives a predetermined number of second signals and detects the completion flag set.

11. An error detection and correction device according to claim 9, wherein the first signal is a main signal and the second signal is a TMCC signal, and wherein both are present in a received signal for satellite digital television broadcasting.

* * * * *